United States Patent
Sterzel et al.

(10) Patent No.: US 7,023,687 B2
(45) Date of Patent: Apr. 4, 2006

(54) HIGH ENERGY DENSITY CAPACITORS

(75) Inventors: Hans-Josef Sterzel, Dannstadt-Schauernheim (DE); Klaus Kühling, Mutterstadt (DE)

(73) Assignee: BASF Aktiengesellschaft, Ludwigshafen (DE)

( * ) Notice: Subject to any disclaimer, the term of this patent is extended or adjusted under 35 U.S.C. 154(b) by 0 days.

(21) Appl. No.: 10/513,361

(22) PCT Filed: May 12, 2003

(86) PCT No.: PCT/EP03/04928

§ 371 (c)(1),
(2), (4) Date: Nov. 3, 2004

(87) PCT Pub. No.: WO03/096362

PCT Pub. Date: Nov. 20, 2003

(65) Prior Publication Data

US 2005/0152090 A1 Jul. 14, 2005

(30) Foreign Application Priority Data

May 14, 2002 (DE) .............................. 102 21 498

(51) Int. Cl.
*H01G 4/228* (2006.01)

(52) U.S. Cl. .............................. 361/306.3; 361/321.2; 361/303

(58) Field of Classification Search ............. 361/301.3, 361/301.4, 303, 306.3, 311–313, 321.2, 321.3, 361/502, 511–512, 530, 329
See application file for complete search history.

(56) References Cited

U.S. PATENT DOCUMENTS

| 4,061,584 A | * | 12/1977 | Girard et al. ............ 106/31.92 |
| 4,587,041 A | | 5/1986 | Uedaira et al. |
| 4,865,877 A | | 9/1989 | Yamaguchi et al. |
| 5,600,535 A | * | 2/1997 | Jow et al. .................... 361/503 |
| 5,790,368 A | * | 8/1998 | Naito et al. .................. 361/523 |
| 6,699,808 B1 | * | 3/2004 | Schwertfeger et al. ........ 501/20 |

FOREIGN PATENT DOCUMENTS

EP 0 411 639 2/1991

* cited by examiner

*Primary Examiner*—Anthony Dinkins
(74) *Attorney, Agent, or Firm*—Oblon, Spivak, McClelland, Maier & Neustadt, P.C.

(57) ABSTRACT

Capacitors having an inert porous shaped body onto which a first electrically conductive layer, a second layer of barium titanate and a further electrically conductive layer have been applied.

12 Claims, 2 Drawing Sheets

HIGH ENERGY DENSITY CAPACITORS

CROSS REFERENCES TO RELATED APPLICATIONS

This application is a national stage application of International Patent Application No. PCT/EP03/04928, filed on May 12, 2003, and claims priority to German Patent Application No. 102 21 498.0 filed on May 14, 2002, both of which are incorporated herein by reference in their entireties.

BACKGROUND OF THE INVENTION

1. Field of the Invention

The present invention relates to capacitors comprising an inert porous shaped body onto which a first electrically conductive layer, a second layer of barium titanate and a further electrically conductive layer have been applied.

2. Description of the Background

Capacitors perform many tasks in information technology and electric energy engineering. There has in recent times been a search for capacitors which have a high energy density and can perform the task of batteries or be used for covering short-term high load requirements.

Electrochemica Acta 45 (2000), 2483 to 2498, discloses electrochemical or double-layer capacitors. These devices, also known as supercapacitors or ultracapacitors, store electric energy in two capacitors which are connected in series and each have an electric double layer which is formed between the two electrodes and the ions in the electrolyte. The distance in which charge separation occurs is only a few Angstrom. As electrolytes, use is made of highly porous carbon having internal surface areas of up to 2 500 m²/g. As indicated by the capacitor formula $$C = E_0 \cdot E \cdot A/d$$

where C is the capacitance, $E_0$ is the absolute dielectric constant, E is the dielectric constant of the dielectric, A is the area of the capacitor and d is the distance between the electrodes, capacitances of up to 100 farad/cm³ are possible at large areas A and small spacings d.

Such double-layer capacitors (supercapacitors) at present achieve energy densities of from 3 to 7 Wh/kg or Wh/liter, which are far below the energy densities of conventional batteries (lithium ion batteries achieve from 150 to 200 Wh/kg). This is due to the maximum possible voltage loading being restricted to about 3.5 V by the electrochemical stability of the electrolyte.

On the other hand, there is a type of capacitor which operates at high voltages, namely ceramic capacitors comprising dielectrics based on barium titanate.

Ceramic capacitors which comprise dielectrics based on barium titanate and operate at high working voltages because of the high dielectric breakdown resistance of the titanates of up to 200 V/0.1 μm are known from the prior art. However, ceramic capacitors have relatively low capacitances.

It is an object of the present invention to remedy the abovementioned disadvantages.

SUMMARY OF THE INVENTION

We have found that this object is achieved by new and improved capacitors which comprise an inert porous shaped body onto which a first electrically conductive layer, a second layer of barium titanate and a further electrically conductive layer have been applied.

DETAILED DESCRIPTION OF THE INVENTION

Figure 1:
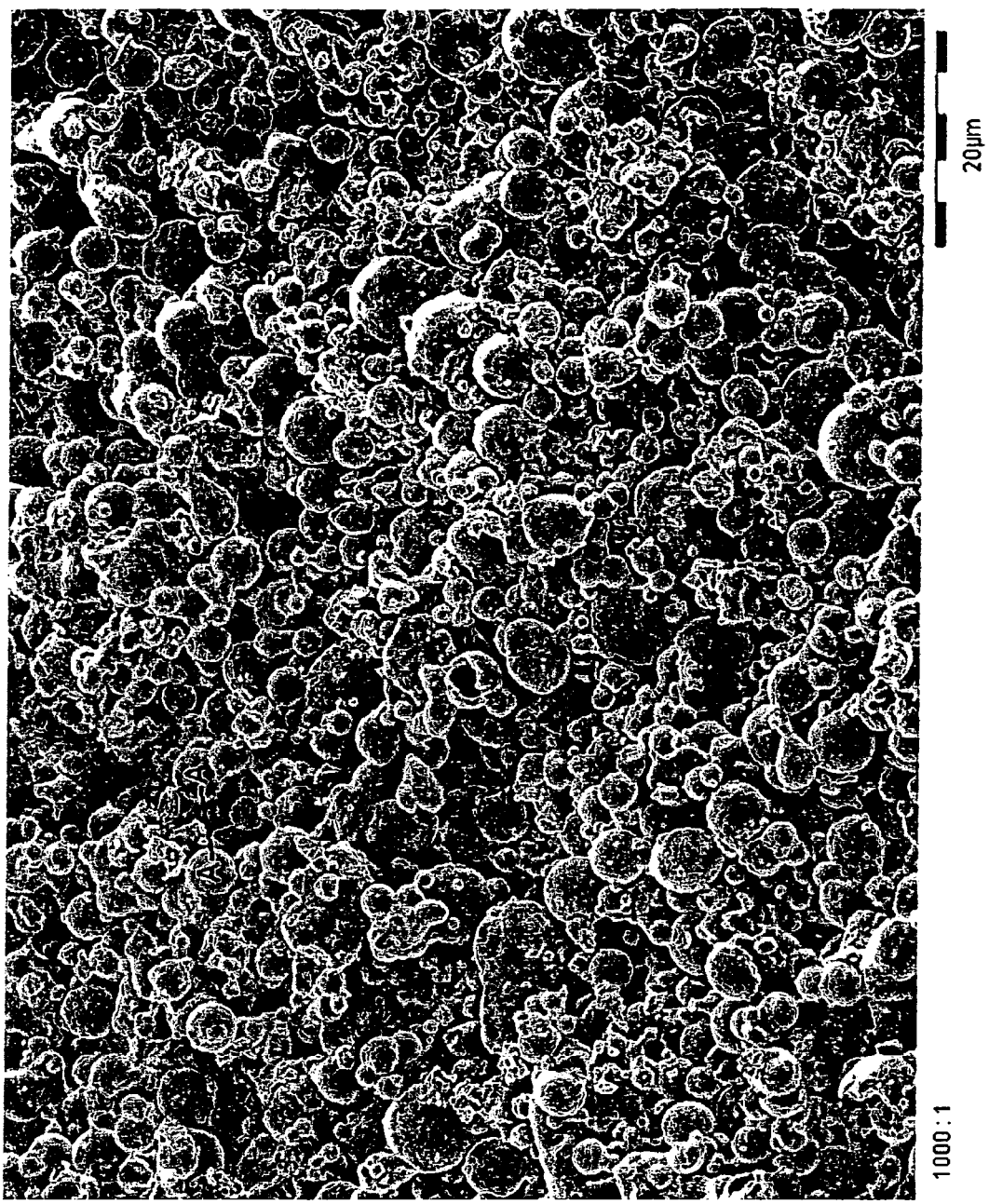
FIG. 1 is an SEM micrograph of an inert porous body, prior to application of any of the layers according to the present invention.
Figure 2:
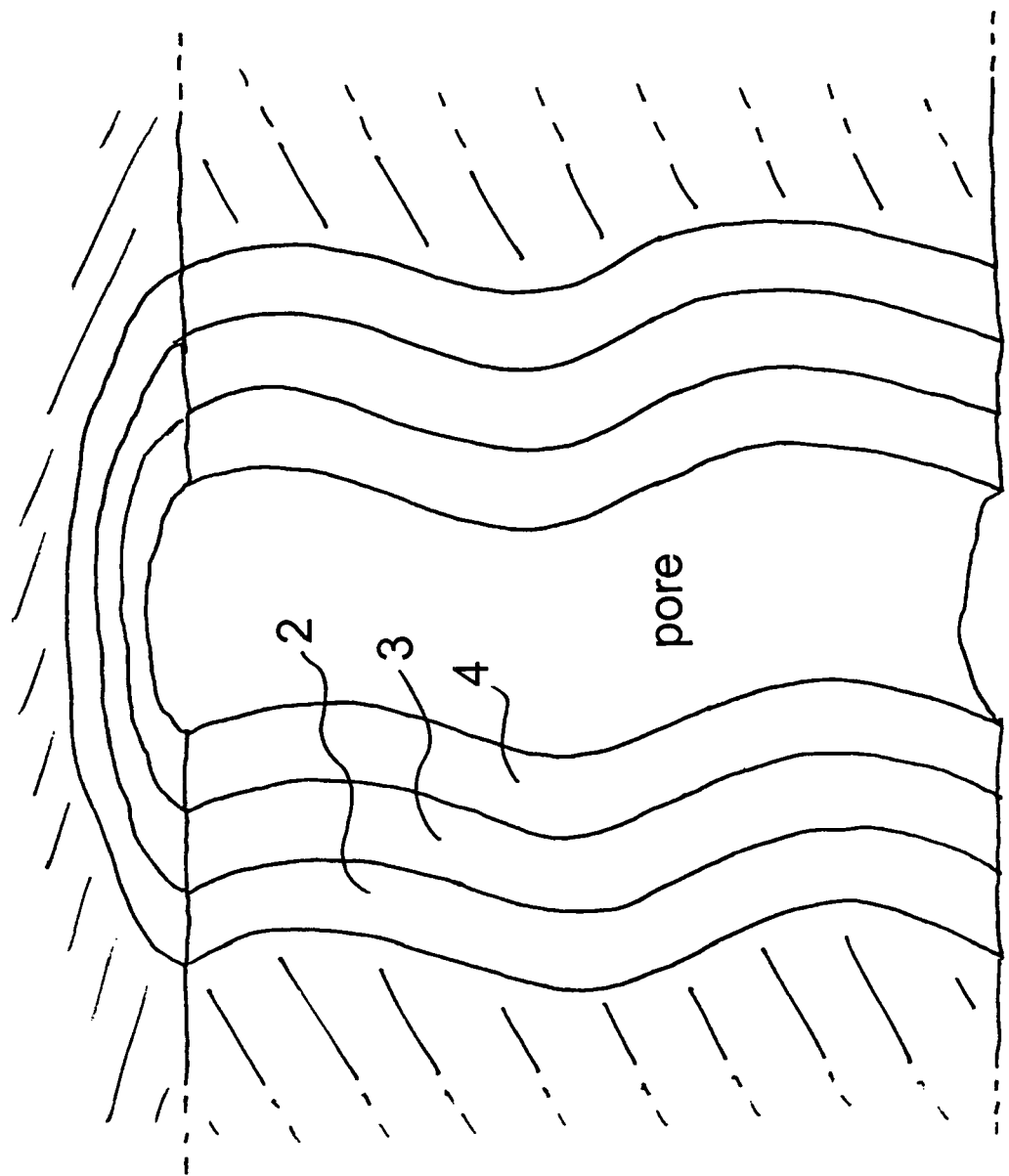
FIG. 2 is a view along section A—A of FIG. 1 showing the layers according to the present invention present on the surface of a pore.

The capacitors of the present invention can be produced as follows:

An inert porous shaped body, shown in FIG. 1, can, in a first step, be provided with a first electrically conductive layer, shown as 2 in FIG. 2, and this can be provided with a contact. A second layer, shown as 3 in FIG. 2, of barium titanate can be applied on top of the first layer and, finally, another electrically conductive layer, shown as 4 in FIG. 2, can be applied on top of this titanate layer and be provided with a contact. The capacitors obtained in this way can be hermetically sealed, e.g. encapsulated, except for the electric contacts.

Suitable porous shaped bodies are in general catalyst support materials, for example those based on metal oxides such as aluminum oxide, silicon dioxide, titanium dioxide, zirconium dioxide, chromium oxide or mixtures thereof, preferably aluminum oxide, silicon dioxide, titanium dioxide, zirconium dioxide or mixtures thereof, particularly preferably aluminum oxide, zirconium dioxide or mixtures thereof, or carbides, preferably silicon carbide, having a BET-surface area of from 0.1 to 20 m²/g, preferably from 0.5 to 10 m²/g, particularly preferably from 1 to 5 m²/g, a pore content of from 10 to 90% by volume, preferably from 30 to 85% by volume, particularly preferably from 50 to 80% by volume, and pore sizes of from 0.01 to 100 μm, preferably from 0.1 to 30 μm, particularly preferably from 1 to 10 μm.

The shaped bodies can have any shapes, for example rings, pellets, stars, wagon wheels, honeycombs, preferably cuboids, cylinders, rectangles or boxes of generally any size (diameter, longest edge length). In the case of capacitors for information technology, for example, the size is generally in the range from 1 to 10 mm. Larger dimensions are necessary in energy engineering.

To produce the first conductive layer on the shaped body, metals such as copper, nickel, chromium or mixtures thereof can be applied in any layer thickness, generally from 10 nm to 1 000 nm, preferably from 50 nm to 500 nm, particularly preferably from 100 nm to 200 nm.

The application of the electrically conductive layer to the shaped body can be carried out using all known methods such as vapor deposition, sputtering or electroless plating, preferably electroless plating. In electroless plating, the shaped bodies are infiltrated or impregnated with suitable, commercially available plating liquids and heated to temperatures below 100° C. to deposit the metal. After metal deposition, the liquid, usually water, can be removed at elevated temperatures and, if desired, under reduced pressure.

It is also possible, for example in the case of iron or nickel, to produce the first conductive layer by heating the shaped bodies in iron carbonyl or nickel carbonyl vapors. In the case of iron, the shaped bodies can be heated to from about 150 to 200° C., and in the case of nickel to from 50 to 100° C.

In a preferred embodiment, the shaped bodies can be heated to elevated temperatures of from 50 to 100° C. in an inert atmosphere (e.g. nitrogen or argon) to produce a homogeneous metal layer. It may be advantageous to apply crystallization nuclei, e.g. nuclei based on platinum metals, likewise by impregnation with suitable liquids (see above).

Finally, the first metal layer can be provided with a contact. This can be carried out, for example, by soldering a metal foil onto an area of the metal-coated shaped body (production of the first electrode).

A dielectric can then be applied on top of the initially produced electrode. This is advantageously carried out using dispersions of crystalline titanate particles having sizes of less than 10 nm in alcohols. Such dispersions can be prepared by reaction of titanium alkoxides with barium hydroxides or strontium hydroxides in alcoholic solution as described in the German application No.: 102 21 499.9 (O.Z. 0050/53537).

The shaped body can be infiltrated or impregnated with such a dispersion which may contain from 5 to 60% by weight, preferably from 10 to 40% by weight, of titanate particles, followed by removal of the alcohol by increasing the temperature to 30–100° C., preferably 50–80° C., and, if desired, reducing the ambient pressure to deposit the titanium particles on the first electrode.

To produce a homogeneous, dense layer of the dielectric, the shaped bodies can be heated to from 700 to 1 200° C., preferably from 900 to 1 100° C., in an inert gas atmosphere so that the titanate particles sinter together to form a dense film.

To increase the layer thickness, the impregnation with the titanate dispersion and the sintering can be repeated a number of times. The layer thickness is generally from 10 to 1 000 nm, preferably from 20 to 500 nm, particularly preferably from 100 to 300 nm.

Finally, a second electrode layer can be applied in a manner analogous to that employed for the first.

After the second electrode layer has been applied, this can be provided with a contact on the side opposite the first contact, thus producing the capacitor. The latter can be hermetically encapsulated to protect it and for the purposes of insulation.

The capacitors of the present invention are suitable as smoothing capacitors or energy storing capacitors or phase shift capacitors in electric energy engineering and as coupling capacitors, filter capacitors or miniature energy storage capacitors in information technology.

The capacitors of the present invention may be illustrated as follows:

A specific surface area (BET surface area) of the porous shaped body of 2 m$^2$/g and a barium titanate layer thickness of 0.1 μm at a relative dielectric constant of 5 000 ("The Effect of Grain Size on the Dielectric Properties of Barium Titanate Ceramic", A. J. Bell and A. J. Moulson, in Electrical Ceramics, British Ceramic Proceedings No. 36, October 1985, pages 57–65) gives a capacitance calculated according to the formula on page 1, line 29, of about 1 farad/cm$^3$. Such a capacitor can be charged to a voltage of 200 V, and its energy density is then 20 000 Ws/cm$^3$ or approximately 5.5 kWh/liter.

We claim:

1. A capacitor comprising an electrically inert, shaped body containing pores therein, onto which the surfaces of at least said pores, a first electrically conductive layer, a layer of barium titanate and a second electrically conductive layer have been applied.

2. A capacitor as claimed in claim 1 consisting of said electrically inert, shaped body containing pores therein, onto which the surfaces of at least said pores, a first electrically conductive layer, a layer of barium titanate and a second electrically conductive layer have been applied.

3. A capacitor as claimed in claim 1, wherein the BET surface area of the inert, shaped body is from 0.1 to 20 m$^2$/g.

4. A capacitor as claimed in claim 1, wherein the pore content of the inert, shaped body is from 10 to 90% by volume.

5. A process for producing said capacitor as claimed in claim 1, said process comprising applying a first electrically conductive layer onto the surfaces of at least said pores of said inert, shaped body, applying a layer of barium titanate on top of said electrically conductive layer and applying a second electrically conductive layer on top of said layer of barium titanate.

6. The capacitor as claimed in claim 1, wherein said capacitor is a smoothing capacitor, energy storage capacitor, phase shift capacitor, coupling capacitor, filter capacitor or miniature energy storage capacitor.

7. A capacitor as claimed in claim 1, wherein said first electrically conductive layer comprises a metal.

8. A capacitor as claimed in claim 7, wherein the metal is selected from the group consisting of copper, nickel, chromium, iron and mixtures thereof.

9. A capacitor as claimed in claim 7, wherein the first electrically conductive layer has a thickness of from 10 nm to 1,000 nm.

10. A capacitor as claimed in claim 7, wherein the first electrically conductive layer is provided with a contact thereon.

11. A capacitor as claimed in claim 1, wherein the layer of barium titanate has a thickness of 10 to 1,000 nm.

12. A capacitor as claimed in claim 10, wherein the second electrically conductive layer has a contact thereon on a side opposite to said contact of said first electrically conductive layer.

* * * * *